United States Patent [19]

Rinaldo

[11] 4,118,757
[45] Oct. 3, 1978

[54] PIN EXTENDER STRIP FOR VERTICALLY MOUNTING MULTI-PIN ELECTRONIC DEVICES

[75] Inventor: Kenneth D. Rinaldo, Santa Clara, Calif.

[73] Assignee: Fairchild Camera and Instrument Corporation, Mountain View, Calif.

[21] Appl. No.: 793,705

[22] Filed: May 4, 1977

Related U.S. Application Data

[62] Division of Ser. No. 627,443, Oct. 30, 1975, abandoned.

[51] Int. Cl.$^2$ .............................................. H05K 1/04
[52] U.S. Cl. .................................... 361/404; 361/421
[58] Field of Search ............... 361/400, 404, 405, 406, 361/408, 421; 339/17 R, 17 L

[56] References Cited

U.S. PATENT DOCUMENTS 3,676,746  7/1972  Kassabgi et al. ..................... 361/415
3,693,131  9/1972  Klehm, Jr. ............................. 361/403
3,868,676  2/1975  Hennessey et al. ................... 361/408

OTHER PUBLICATIONS

Augat Data Sheet 166R, Augat Inc., Jan. 1974.

Primary Examiner—David Smith, Jr.
Attorney, Agent, or Firm—Alan H. MacPherson; Robert C. Colwell; Paul J. Winters

[57] ABSTRACT

A mounting arrangement is provided whereby an electronic display device with contact pins accessible on one side is mounted on a printed circuit board by means of a plurality of elongated pin extender elements connected between individual ones of the contact pins and points of contact on associated ones of the conductive leads on the printed circuit board, the elements having pin receiving means for receiving the pins and being oriented at an off-orthogonal angle with respect to said printed circuit board and the pin extender elements form a triangulated structural support for the display device.

3 Claims, 7 Drawing Figures

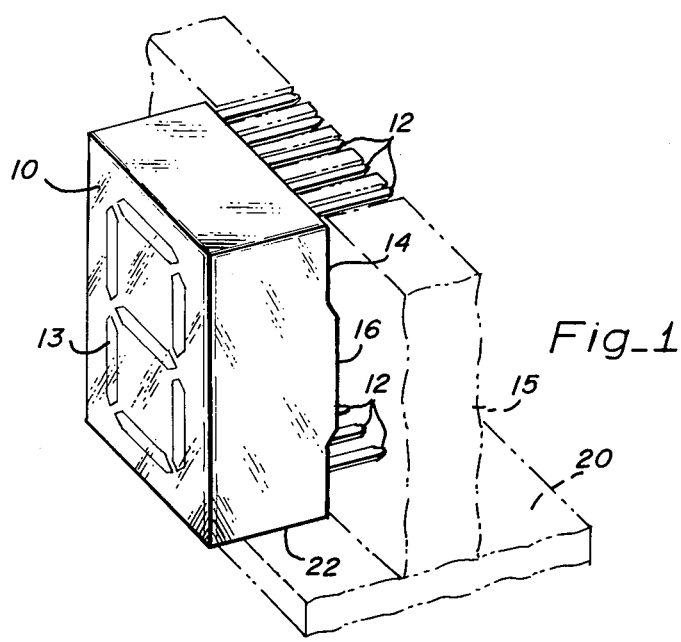
Fig_1
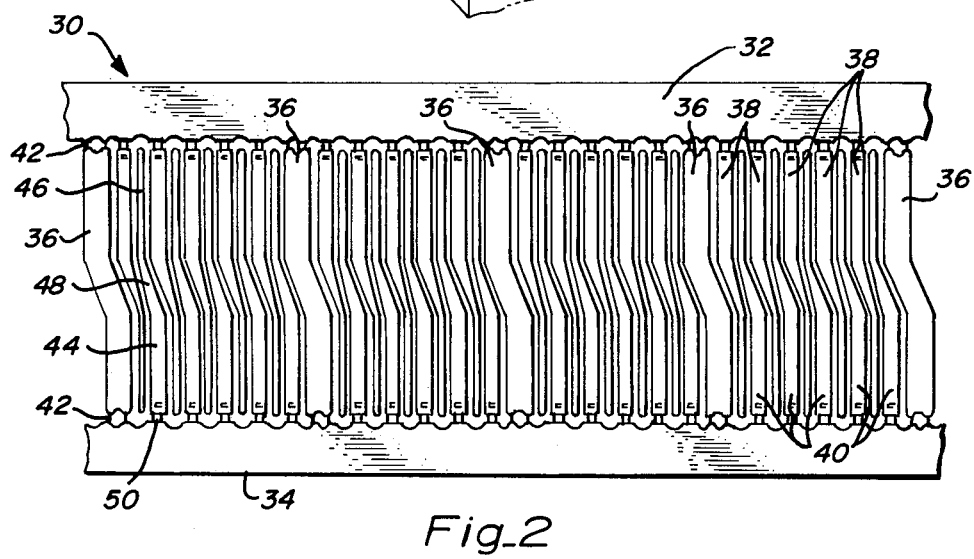
Fig_2
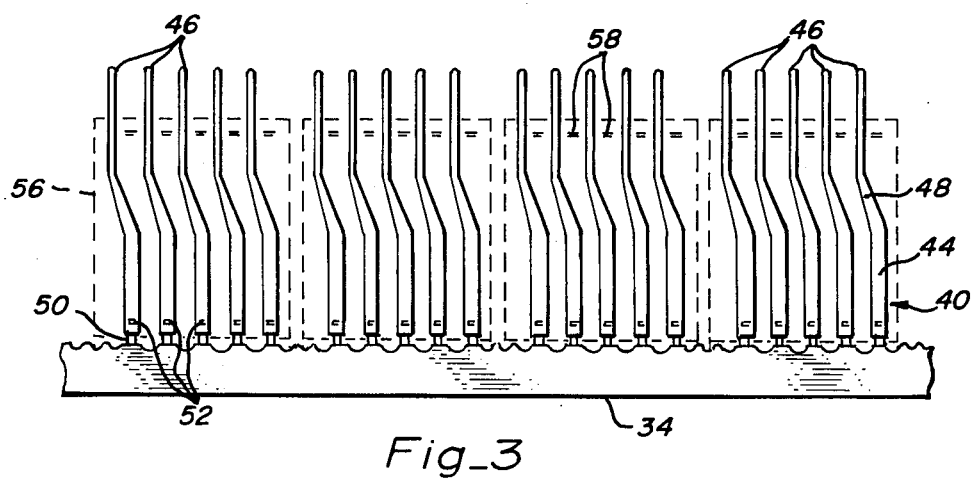
Fig_3

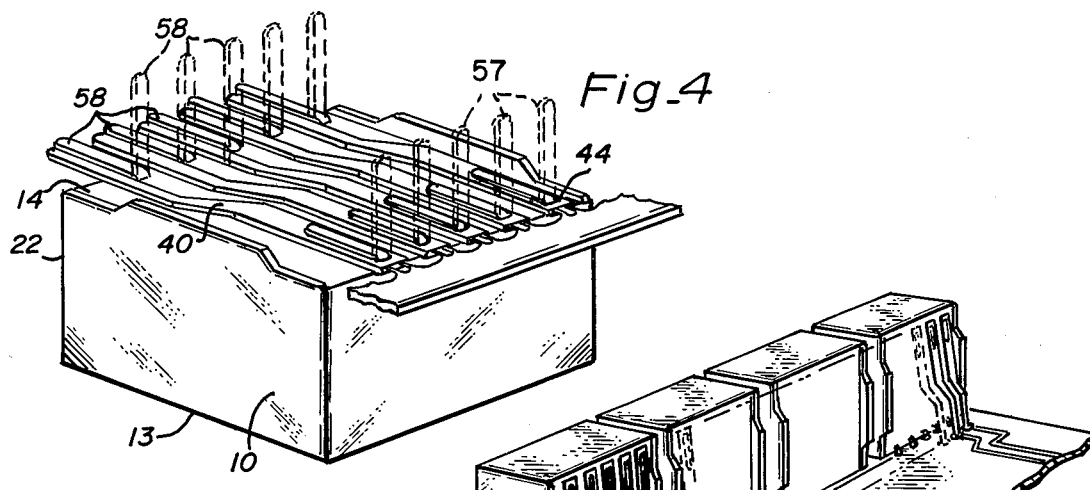
Fig_4
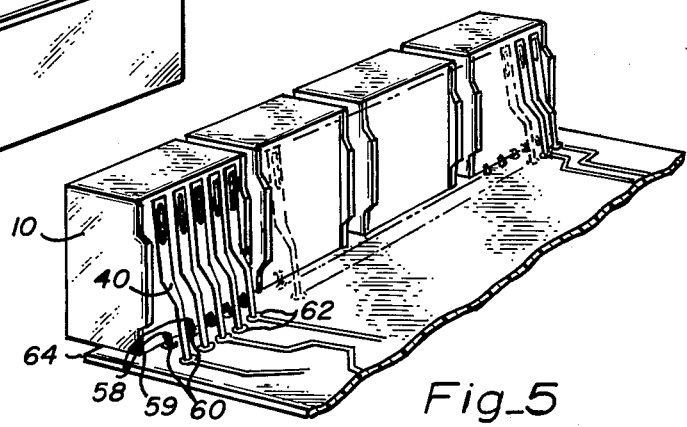
Fig_5
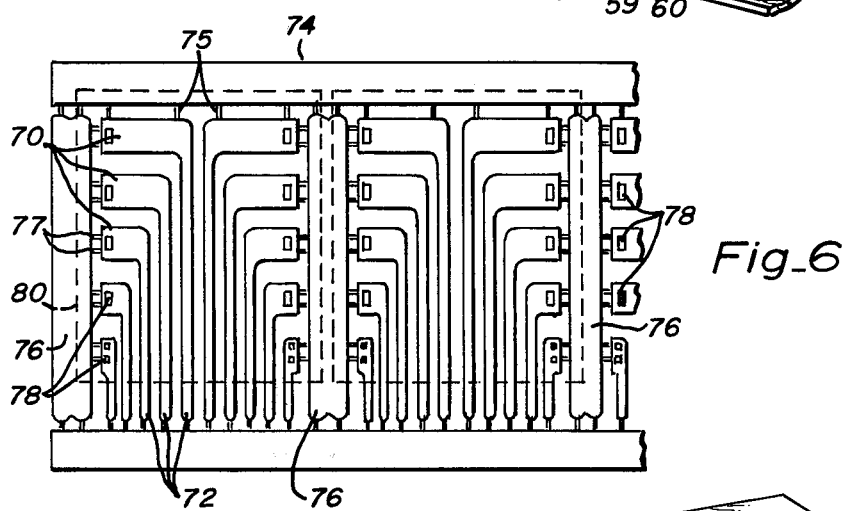
Fig_6
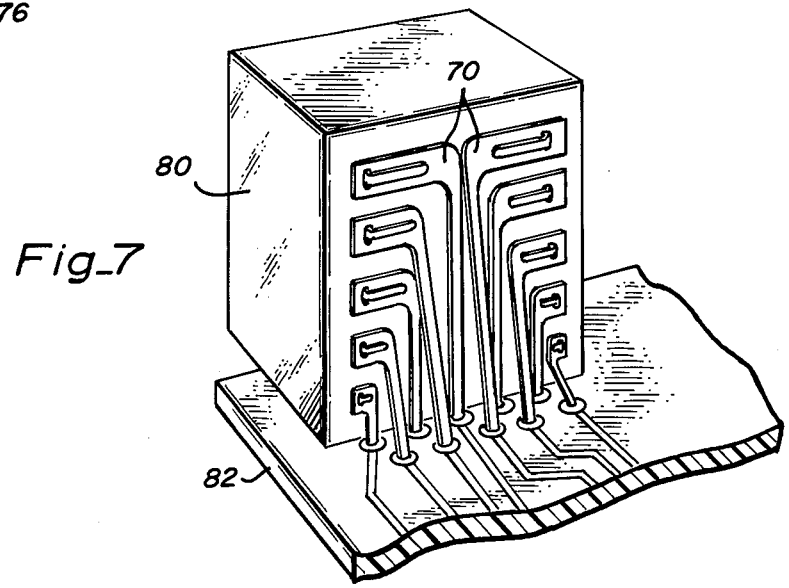
Fig_7

PIN EXTENDER STRIP FOR VERTICALLY MOUNTING MULTI-PIN ELECTRONIC DEVICES

This application is a divisional of co-pending application Ser. No. 627,443, filed Oct. 30, 1975 now abandoned.

BACKGROUND OF THE INVENTION

1. Field of the Invention

The present invention relates generally to electronic device connecter apparatus and more particularly to a mounting arrangement for the orthogonal mounting of an electronic display device to a printed circuit board.

2. Description of the Prior Art

Because early applications of electronic devices such as light-emitting diodes (LED) and dual-in-line packaged (DIP) devices involved a horizontally mounting of the device to a printed circuit board, and available panel area and component density were not critical, the manufacturers of such devices adapted them for horizontal mounting by placing the lead pins in rows along opposite edges of the bottom surfaces of the device. As board densities and types of applications have increased, some applications have demonstrated that the horizontal mounting of device to board should be reconsidered. This is particularly true in cases where LED-indicating devices are used in instrumentation circuits and the like designed for plural instrument panels. For such applications it has become apparent that in order to conserve panel area, the supporting electronic circuitry must be mounted on boards extending normal to the panel face and the actual indicator devices must be mounted with their indicating face lying normal to the board. In order to use currently available LEDs, for example, a narrow second board for carrying the LEDs is attached to the forward edge of the primary circuit board and is mounted normal thereto. However, in order to establish good plugable interconnection between circuit boards, great precision must be exercised in the manner of connection of the two boards. This, of course, adds to the overall cost of the device over and above the added cost of providing the second board. Another disadvantage of this approach is that in most cases where the primary board layout must be changed, a redesign of the secondary board is also required.

Although it would appear to be a simple matter to change the lead frame structure of the LED or electronic device in order to make it mountable in the vertical position, it turns out that not only would the manufacturer have to undergo substantial tooling expenses in order to make a conversion of the device itself, but the assembly lines of device users would have to likewise be modified thereby causing an industry capital expenditure of enormous sums of money.

SUMMARY OF THE PRESENT INVENTION

It is therefore a primary object of the present invention to provide a means for facilitating the vertical mounting of a normally horizontally mounted multi-pin electronic device.

Another object of the present invention is to provide a novel lead frame structure into which a plurality of multi-pin electronic devices can be mounted simultaneously, speedily and conveniently, and the resulting lead frame additions can be used to vertically mount the devices to a printed circuit board.

Briefly, the preferred embodiments of the present invention include arrays of specifically configured and positioned metallic pin extender elements, retainer bars and spacers adapted so that the normally horizontally mounted electronic devices can be easily attached to the extender elements and the frangible retainer bars and spacers can be broken away and the device thereafter mounted to a conventional printed circuit board to stand in a vertical orientation relative to the board.

The primary advantage of the present invention is that it provides a simple method and apparatus for vertically mounting normally horizontally mounted electronic devices.

Another advantage of the present invention is that it provides an economical, convenient and practical means for mounting normally horizontally mounted electronic devices vertically with respect to a printed circuit board.

Other objects and advantages of the present invention will no doubt become apparent to those of ordinary skill in the art after having read the following detailed disclosure of the preferred embodiments which are illustrated in the several figures of the drawing.

IN THE DRAWING

FIG. 1 is a perspective illustration of a normally horizontally mounted multi-pin indicator device;

FIG. 2 is a plan view of a preferred embodiment of a strip of pin extenders in accordance with the present invention;

FIG. 3 is a plan view showing a portion of the strip illustrated in FIG. 2;

FIG. 4 is a perspective view showing a broken portion of the strip illustrated in FIG. 3 mounted to a multi-pin electronic device;

FIG. 5 is a perspective view illustrating the manner in which the present invention is used to mount multi-pin devices in a vertical disposition on a printed circuit board;

FIG. 6 is a plan view illustrating a broken segment of an alternative embodiment of a strip in accordance with the present invention; and FIG. 7 is a broken perspective view illustrating the manner in which the strips shown in FIG. 6 may be used to vertically mount a second type of electronic device.

DETAILED DESCRIPTION OF THE PREFERRED EMBODIMENT

Referring now to FIG. 1 of the drawing, there is shown a seven-segment numerical indicator device 10 having 10 contact pins 12 arrayed five each across the upper edge and lower of its back side 14. This type of device is normally mounted to a printed circuit board, such as that illustrated in phantom by the broken lines 15, by inserting the pins 12 into pin-receiving openings in the board and depressing the device downward onto the board until the side edge extensions 16 are flush with the board. The pins are then soldered to the conductors surrounding the pin openings. As previously indicated above, in order to reduce the frontal area of the apparatus incorporating device 10, the board 18 comprises a secondary board which is mated to a primary circuit board 20, thus giving rise to the disadvantages mentioned above.

In order to avoid such disadvantages, the present invention provides a means by which the device 10 can be mounted directly to the board 20 with its side 22 in contact therewith. As will be further developed below, this is accomplished by providing pin extenders for either one or both sets of the device pins 12 so that the need for the secondary board can be obviated and the device can be vertically mounted directly to the primary board. A preferred embodiment of a strip of pin extenders in accordance with the present invention is illustrated at 30 in FIG. 2 and includes two interdigitated sets of 4 five-pin extenders such as those illustrated in FIG. 3. More particularly, the strip 30 includes a pair of breakaway retainer bars 32 and 34, and five breakaway spacers 36 separating groups of ten interdigitated pin extenders 38 and 40. Note that the spacers 36 are frangibly attached at their ends to the retainer bars by narrow segments of metal 42.

Referring additionally to FIG. 3 wherein the retainer 34 and extenders 40 are shown broken away from the strip 30, the pin extenders 38 and 40 are each comprised of an elongated end portion 44 which is relatively wide, an elongated opposite end portion 46 which is relatively narrow, and a midportion 48 which transitions from the width of end portion 44 to the width of end portion 46. Note that in addition to being narrower than end portion 44, end portion 46 is also laterally offset relative to portion 44 by a predetermined distance. In the illustrated embodiment the lateral offset is such that the center line of portion 46 is displaced from the center line of portion 44 by 0.050 inch. However, this dimension will vary depending upon the pin spacing of the particular device. In the present embodiment the distance between the center line of the adjacent extenders in each five-pin extender set is 0.100 inch. The distal end of each wide portion 44 is frangibly attached to the retainer bar 34 by narrow segments of metal 50. An aperture is provided proximate the frangibly attached end of each extender and is of suitable dimension for receiving a pin of the device to which the extenders are to be attached. The distal ends of the narrow portions 46 are not attached to the retainer 32.

Superimposed over the assembly 54 in FIG. 3 are dashed lines 56, representing the outer boundaries of devices to which the extenders 40 are to be attached, and one row of device pins is shown at 58. The other row of device pins (which are labeled later herein as 57) is not shown in FIG. 3 as they will be positioned concentric with the openings 52 at the ends of extenders 40. Note that the pins 58 are aligned with the pins to be received within the openings 52 and that in the positions illustrated the narrow end portions 46 lie between the pins 58.

Turning now to FIG. 4 of the drawing, the method by which the extenders 40 are attached to a device pin is further illustrated. In this illustration the device 10 is shown with its numeral indicating side 13 facing downward and its opposite or rear side 14 facing upward. To assemble the extenders 40 to the devices 10, the devices are first positioned face down as illustrated in FIG. 4 and the partial strip 54 illustrated in FIG. 3 is positioned thereover so that the pins 57 on one side of the device extend through the openings 52 in the extenders. All of the pins 57 and 58 are then bent toward the lower side 22 of device 10 as illustrated, and the pins 57 that are mated with the openings 52 are flow-soldered to the wide portions 44 as illustrated.

The set of four indicators now having the extender assembly attached thereto is ready to be mounted to a printed circuit board in which two rows of pin holes 60 and 62 are provided, with the holes in each row being located on 0.100 inch centers; the holes of one of the rows being offset relative to the other row by 0.050 inch. As indicated in FIG. 5 the devices 10 may be mounted to the board 64 by inserting the pins 58 into the board openings 60 and by inserting the extenders 40 into the openings 62 and then soldering them into place. Since the pins 58 rigidly secure the lower portion of device 10 to board 64, the primary concern from a structural standpoint is to resist the tendency of the device to rotate about the edge 59. The extenders 40 are ideally suited for this purpose in that they provide a more or less A-frame or triangular configuration which tends to buttress the device 10 and resist any rotational tendency. Once the pins 58 and extenders 40 are firmly soldered in the opening 60 and 62, the retainer strip 34 can be broken away and the assembly is completed. The extenders 40 thus accomplish three primary functions; namely, they permit a normally horizontally mounted multi-pin device to be mounted vertically on a printed circuit board, they provide rigid support for the device and they permit the use of offset pin holes on the printed circuit board as indicated.

In the previously described preferred embodiment, the indicator device 10 was of a type having a horizontal pin layout relative to the display numeral. However, an alternative 10-pin device has its pins oriented vertically with respect to the numeral. In order to accommodate such a device, an alternative extender pin strip such as that illustrated in FIG. 6 of the drawing must be provided. In this embodiment extenders 70 are provided for all 10 pins of the device and such extenders are laid out so that the center lines of the distal ends 72 lie on 0.050 inch centers. As in the previous embodiment, break-away retainers 74 and break-away spacers 76 are frangibly attached to the ends of extenders 70 by narrow strips of metal 75 and 77. Also similarly, each extender is provided with an opening for receiving one of the pins of the device.

In order to mount the extenders 70 to one or more devices, the devices indicated by the dashed lines 80 are inverted and the strip is positioned thereover with its pins aligned with the openings 78. The pins are then slipped through the openings, and then trimmed and soldered to the extenders. Thereafter, the retainers 74 and spacers 76 may be broken away leaving a device or series of devices which can be mounted to a printed circuit board 82 as indicated in FIG. 7. Note that this configuration provides a triangulated support for the device 80 similar to that shown in FIG. 5.

In the preferred embodiments the strips are made of solder-plated beryllium-copper. However, it is to be understood that other suitable metals could be used. The principal requirements are that the material be fairly rigid and be a good conductor of electricity.

Although only two preferred embodiments of the present invention have been described and illustrated in detail above, it is to be appreciated that other layouts and configurations of extender pin strips could likewise be provided to accomplish the same purpose served by the present invention. It is therefore to be understood that the appended claims are to be interpreted as covering all such alternative layouts and configurations that fall within the true spirit and scope of the invention.

What is claimed is:

1. In combination, an electronic display device having contact pins accessible on one side thereof, a printed circuit board having conductive leads formed thereon, and a plurality of elongated pin extender elements connected between individual ones of said contact pins and points of contact on associated ones of said conductive leads, each of said extender elements having pin receiving means for receiving said pins and being oriented at an off-orthogonal angle with respect to said printed circuit board, so that said display device is mounted orthogonal to said printed circuit board with said extender elements extending at an angle from said display device to said printed circuit board and forming a triangulated structural support for said display device.

2. The combination of claim 1 wherein each of said extender elements includes a first elongated portion and a second elongated portion, said second portion being relatively narrow in width as compared to said first portion and being deflected out of alignment with said first portion, and wherein pins protruding from the bottom of said display device are connected directly to associated ones of said conductive leads.

3. The combination of claim 1 wherein said extender elements are connected to said leads at points of contact which form a staggered pattern on said printed circuit board with alternate ones of said extender elements forming said triangulated structural support, said staggered pattern permitting more pins to be connected along a unit length of an edge of a printed circuit board.

* * * * *